(12) United States Patent
Dunn

(10) Patent No.: US 6,738,683 B1
(45) Date of Patent: May 18, 2004

(54) APPARATUS AND METHOD FOR CLEANING A BELL JAR IN A BARREL EPITAXIAL REACTOR

(75) Inventor: Frank J. Dunn, Merrimack, NH (US)

(73) Assignee: CXE Equipment Services, LLC, Manchester, NH (US)

( * ) Notice: Subject to any disclaimer, the term of this patent is extended or adjusted under 35 U.S.C. 154(b) by 700 days.

(21) Appl. No.: 09/655,602

(22) Filed: Sep. 5, 2000

(51) Int. Cl.[7] .............................................. G06F 19/00
(52) U.S. Cl. ........................ 700/121; 700/299; 700/304
(58) Field of Search ........................ 700/90, 121, 299, 700/304; 134/19; 118/666

(56) References Cited

U.S. PATENT DOCUMENTS

| | | | |
|---|---|---|---|
| 4,047,496 A | 9/1977 | McNeilly et al. | 118/725 |
| 4,081,313 A | 3/1978 | McNeilly et al. | 117/103 |
| 4,421,786 A | 12/1983 | Mahajan et al. | 117/101 |
| 4,496,609 A | 1/1985 | McNeilly et al. | 427/585 |
| 4,496,828 A | 1/1985 | Kusmierz et al. | 219/405 |
| 4,511,788 A | 4/1985 | Arai et al. | 219/405 |
| 4,563,367 A * | 1/1986 | Sherman | 427/563 |
| 4,641,603 A | 2/1987 | Miyazaki et al. | 118/724 |
| 4,728,389 A | 3/1988 | Logar | 117/97 |
| 4,734,012 A * | 3/1988 | Dob et al. | 417/32 |
| 4,789,771 A | 12/1988 | Robinson et al. | 219/405 |
| 4,858,557 A | 8/1989 | Pozzetti et al. | 118/725 |
| 4,923,681 A * | 5/1990 | Cox et al. | 422/116 |
| 4,976,217 A * | 12/1990 | Frijlink | 118/733 |
| 5,053,247 A | 10/1991 | Moore | 427/586 |
| 5,062,386 A | 11/1991 | Christensen | 118/725 |
| 5,152,842 A | 10/1992 | Urata et al. | 118/725 |
| 5,160,545 A | 11/1992 | Maloney et al. | 118/725 |
| 5,207,835 A | 5/1993 | Moore | |
| 5,279,986 A | 1/1994 | Maloney et al. | 117/88 |
| 5,288,364 A | 2/1994 | Burt et al. | 117/86 |
| 5,441,571 A | 8/1995 | Ohta et al. | 118/730 |
| 5,818,194 A * | 10/1998 | Nordby | 318/701 |
| 5,855,677 A | 1/1999 | Carlson et al. | |
| 6,019,839 A | 2/2000 | Achutharaman et al. | 117/88 |
| 6,026,891 A | 2/2000 | Fujiyoshi et al. | |

FOREIGN PATENT DOCUMENTS

| | | |
|---|---|---|
| EP | 0296804 A2 | 6/1988 |
| EP | 0808917 A1 | 11/1997 |
| WO | WO 02/20881 A2 * | 8/2001 |

* cited by examiner

Primary Examiner—Leo Picard
Assistant Examiner—Chad Rapp
(74) Attorney, Agent, or Firm—Robert R. Deleault, Esq.; Mesmer & Deleault, PLLC

(57) ABSTRACT

An epitaxial cleaning apparatus has a blower controller module and controller module code. The blower controller module is connected between a blower of an epitaxial deposition device having a reaction chamber, a blower and a plurality of plenum chambers for delivering cooling air from the blower to the reaction chamber, and a blower power source for controlling the speed of the blower. The controller module code for controlling the blower controller module is installed within a control module connected to the epitaxial deposition device for controlling the operation of the epitaxial deposition device

13 Claims, 2 Drawing Sheets

APPARATUS AND METHOD FOR CLEANING A BELL JAR IN A BARREL EPITAXIAL REACTOR

BACKGROUND OF THE INVENTION

1. Field of the Invention

The present invention relates generally to the field of silicon wafer fabrication equipment useful in the manufacture of semiconductor devices. Particularly, the present invention relates to an epitaxial growing apparatus and method for growing an epitaxial thin film layer of a semiconductor substance on a substrate mounted on a support member which is heated by high frequency energy or infrared radiation ray in a gas-tight reaction chamber. More particularly, the present invention relates to an epitaxial growing apparatus and method for controlling the operation of an epitaxial reactor. Yet more particularly, the present invention relates to an epitaxial growing apparatus and method for controlling the operation of an epitaxial reactor that includes a method and apparatus to provide a controlled high etch procedure for cleaning the epitaxial reaction chamber.

2. Description of the Prior Art

Epitaxy is the oriented crystalline growth between two crystalline solid surfaces. More typically, epitaxy refers to the growth of a crystalline layer upon a crystalline substrate. One common technique for epitaxial growth is chemical vapor deposition (CVD). In the microelectronics industry, for example, crystalline silicon is epitaxially grown upon silicon wafer substrates in a heated reactor. The reactors are called epitaxial reactors.

A conventional epitaxial reactor is a barrel reactor having a CVD chamber in which a barrel-like holder or susceptor is mounted so as to rotate about its vertical axis. Semiconductor wafers are placed in recessed pockets defined by the susceptor. The susceptor holds the wafers in a manner that permits the wafers to have maximum surface area exposure to the chemical vapor while utilizing the force of gravity to retain the wafers within the pockets. A barrel reactor also has gas inlets near the top of the CVD chamber and an exhaust port near the bottom of the CVD chamber such that gas entering the chamber generally flows downwardly over the wafers prior to exiting the chamber by way of the exhaust port. An array of heat lamps is arrayed around the CVD chamber. The radiant energy produced heats the susceptor to the required processing temperature for depositing the desired material. A cooling airflow path extends from a blower through a tapered input duct to a large plenum chamber that coaxially surrounds and extends over the top of the CVD chamber. From this plenum chamber cooling air flows coaxially downward over the surface of the quartz bell jar which forms the CVD chamber and radially inward through the banks of radiant heater lamps surrounding the bell jar.

U.S. Pat. No. 5,288,364 (1994, Burt et al.) discloses an epitaxial reactor that includes a bell jar in which the epitaxial depositions are performed. During an epitaxial deposition cycle, an infrared detector monitors the temperature of the bell jar. After the temperature reaches a predetermined value, initiation of further epitaxial deposition cycles is inhibited.

U.S. Pat. No. 5,279,986 (1994, Maloney et al.) discloses a method of processing a semiconductor substrate for depositing an epitaxial layer by chemical vapor deposition in an epitaxial reactor that includes a cooling air flow path extending from a blower through a tapered input duct to a large plenum chamber. The plenum chamber extends over the top of the deposition apparatus. From the plenum chamber cooling air flows coaxially downward over the surface of the quartz bell jar which forms the reaction chamber and radially inward through the banks of radiant heater lamps coaxially surrounding the bell jar.

U.S. Pat. No. 5,160,454 (1992, Maloney et al.) discloses an epitaxial layer by chemical vapor deposition in an epitaxial reactor that includes a cooling air flow path extending from a blower through a tapered input duct to a large plenum chamber. The plenum chamber extends over the top of the deposition apparatus. From the plenum chamber cooling air flows coaxially downward over the surface of the quartz bell jar which forms the reaction chamber and radially inward through the banks of radiant heater lamps coaxially surrounding the bell jar.

U.S. Pat. No. 5,152,842 (1992, Urata et al.) discloses a reactor for epitaxial growth where a susceptor on which semiconductor wafers are placed is heated by a heater. The susceptor is rotated around a vertically provided gas feed pipe in a bell jar. The gas introduced into the bell jar through the gas feed pipe is decomposed to deposit a crystalline semiconductor material on the wafers. The wafers are positioned in pockets of the susceptor and the pockets are arranged on the uniform temperature region of the susceptor.

U.S. Pat. No. 4,858,557 (1989, Pozzetti et al.) discloses a reactor for chemical vapor deposition of epitaxial layers on crystalline substrates using a medium frequency heating system. The power for the heating is produced by a multi-turn coil, inducing electrical currents in a susceptor of electrically conductive material housed in a transparent bell jar. The internal sides of the turns of the coil are optically finished to reflect back heat to the susceptor irradiated by the coil during operation. Heating is controlled by subtracting or adding reactive currents from or to different turns of the coil and through properly shaping the walls of the susceptor in order to control temperature gradients within.

During normal operation of the epitaxial reactor, the deposited silicon coats certain internal parts of the reactor used to hold the silicon wafers. When this deposit reaches a certain thickness, it must be removed before it can begin to ablate off and cause contamination in the form of solid phase silicon particles. These particles will cause defects in the silicon film deposited on subsequent silicon wafers processed through the reactor.

In all chemical vapor deposition epitaxial reactors, silicon is allowed to accumulate on the susceptor in order to assist in forming a uniform epitaxial layer thickness on each of the wafers. Unfortunately, some of the silicon accumulates onto the inside surface of the bell jar developing a haze. Silicon is periodically removed from the susceptor by a procedure commonly referred to as a high rate etch. In order to remove this deposited silicon from the susceptor, the reactor is heated to a high temperature in the presence of a reactant gas. Typically the temperature is in the range of about 1,100 degrees Celsius to about 1,300 degrees Celsius, and the reactant gas is a high percent molar volume of hydrogen chloride gas. Once the reaction chamber reaches the required high temperature, the reactant gas is introduced into the chamber. The gas etches the deposited silicon from the susceptor and is removed from the chamber through an exhaust port. All other surfaces of the reaction chamber do not reach a sufficient temperature for this reaction to occur. Consequently, after repeatedly performing deposition cycles followed by a high etch operation, the bell jar must eventually be removed and cleaned with a wet etch.

A disadvantage of doing a wet etch is the number of hours the reactor is unavailable for producing wafers. Also, each time the reactor is opened for wet etch cleaning, the useable life of the reactor's lamps and seals is reduced. This increases the reactor's operating costs and increases the wafer's manufacturing costs.

Therefore what is needed is an epitaxial cleaning apparatus and method that extends the number of deposition-etch sequences. What is further needed is an epitaxial cleaning apparatus and method that extends the number of deposition-etch sequences by controlling the cooling air that passes over the bell jar. What is still further needed is an epitaxial cleaning apparatus and method that extends the number of deposition-etch sequences by reducing the air flow of the cooling air that passes over the bell jar thereby allowing the temperature of the jar to increase during a high etch procedure causing the haze to be substantially removed. What is also further needed is an epitaxial cleaning apparatus and method that extends the useful lifetime of the reactor's lamps and seals and decreases the reactors operating costs and the wafer manufacturing costs.

SUMMARY OF THE INVENTION

It is an object of the present invention to provide an epitaxial cleaning apparatus and method that extends the number of deposition-etch sequences of an epitaxial reactor. It is a further object of the present invention to provide an epitaxial cleaning apparatus and method that extends the number of deposition-etch sequences by controlling the cooling air that passes over the bell jar. It is another object of the present invention to provide an epitaxial cleaning apparatus and method that extends the number of deposition-etch sequences by reducing the air flow of the cooling air that passes over the bell jar during a high etch procedure thereby allowing the temperature of the jar to increase causing the haze to be substantially removed. It is still another object of the present invention to provide an epitaxial cleaning apparatus and method that extends the useful lifetime of the reactor's lamps and seals and decreases the reactors operating costs and wafer manufacturing costs.

The present invention achieves these and other objectives by providing a system that includes a variable speed motor controller of sufficient size to drive the blower motor of an epitaxial reactor and program code means to control the variable speed motor controller. A typical barrel epitaxial reactor has five main components, the reaction chamber, the gas flow control system, the SCR temperature control system, the air-cooling system, and the control console. The reaction chamber is made up of three distinct components, the susceptor, the quartz bell jar and the quartz heating lamps. The susceptor is a silicon carbide coated graphite holder for the silicon wafers that undergo processing. Graphite is used because it is opaque to the infrared radiation emitted by the quartz lamps used for heating the reaction chamber. Being opaque causes the susceptor to absorb all the radiant energy of the quartz lamps. This in turn causes the susceptor to heat up to the required processing temperature for the silicon wafers.

The quartz bell jar surrounds the susceptor and contains all process gases within close proximity to the susceptor so that the required chemical reactions occur near the silicon wafers loaded on the susceptor. Process gases are introduced into the bell jar at its top through a series of water-cooled, metal sealing flanges. The gases are exhausted out the bottom through a water-cooled exhaust flange. The bell jar is constructed of quartz because quartz is transparent to the radiant energy produced by the quartz heating lamps.

The quartz heating lamps are arrayed on approximately five lamp modules within the reaction chamber. The lamp modules surround the quartz bell jar. Because the lamp modules surround the bell jar, they do not come in contact with any of the process gasses.

The gas flow control system supplies all required carrier gases, reactant gases and purge gases to the reaction chamber. The gases are supplied and metered through a series of pressure regulators, valves and mass flow controllers. The preferred carrier gas used in this type of system is hydrogen gas. The reactant gases are divided into two basic types, silicon sources and dopant sources. Examples of silicon-source gases are dichlorosilane, silane, silicon tetrachloride, and trichlorosilane. Examples of dopant-source gases are arsine, phosphine and diborane. The purge gases are required to evacuate all process gases from the reaction chamber after processing is complete. Examples of typical purge gases are nitrogen and argon.

The SCR temperature control system delivers power to the reaction chamber quartz lamps used for heating the susceptor to the proper processing temperature. Normal processing temperatures are typically in the range of about 900 degrees Celsius to about 1,250 degrees Celsius.

The air-cooling system supplies forced cooling air to all lamp modules used for heating the reaction chamber and to the outside surface of the quartz bell jar. Cooling of the bell jar is required in order to reduce the bell jar's inside surface temperature below the activation energy required to deposit silicon. Typically, the bell jar wall temperature normally does not exceed about 600 degrees Celsius. The elevated temperatures within the bell jar are meant to cause the reactant gases to react and deposit silicon on the susceptor and silicon wafers. Allowing the bell jar wall temperature to increase in temperature above the activation energy required to deposit silicon would cause silicon to be deposited on the bell jar's inside surface at a much faster rate than is currently experienced with current systems. This condition would interfere with the radiant energy produced by the lamp modules, causing uneven heating of the susceptor. The end result would be an unstable deposition of silicon on the silicon wafers. Furthermore, silicon deposited on the inside wall of the bell jar would begin to ablate off the inside surface once a predetermined silicon layer thickness was reached. This would cause particles of solid-phase silicon to come in contact with the silicon wafers inducing defects in the deposited epitaxial layer.

The control console controls all aspects of epitaxial reactor operation. The control console does this through special software designed to control all aspects of this delicate process.

Although the force air cooling system cools the bell jar to a temperature of about 600 degrees Celsius, some silicon will deposit on the inside wall of the bell jar. When this deposited silicon on the inside wall of the bell jar becomes too thick, the reaction chamber must be disassembled, the bell jar removed and then etched in an acid bath to remove all deposits. This procedure is normally required after approximately 1,000 to 1,200 microns of silicon growth has been deposited during normal silicon wafer processing. The task of disassembly, wet etching and re-assembly takes up a relatively large amount of time and many times induces process changes that must be corrected before silicon wafer processing can resume.

The use of an etching process that removes deposited silicon from the inner wall of a quartz bell jar and does not require the removal of the bell jar increases available production time. Incorporation of the present invention into existing epitaxial reactors or building new epitaxial reactors with the described features of the present invention increases available production time of the epitaxial reactor. The inventors of the present invention have discovered a method and apparatus that accomplishes this in-situ etching process. The present invention's process is accomplished by reducing the rpm of the systems integral, forced-air cooling blower that is used to cool the outside of the bell jar. By reducing the rpm of the cooling blower, the actual temperature of the inner wall of the bell jar increases. The higher temperature, which is developed on the inside surface of the bell jar, exceeds the activation energy required for the gas-phase reaction shown in Eq. 1.

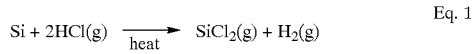

$$\text{Si} + 2\text{HCl}(g) \xrightarrow{\text{heat}} \text{SiCl}_2(g) + \text{H}_2(g) \qquad \text{Eq. 1}$$

The byproducts of Silicon chloride and hydrogen gas are removed from the reaction chamber by way of the system's exhaust port.

The reduction in the forced-air cooling blower's rpm is accomplished by the use of the present invention's motor controller. The motor controller is installed between the blower's power source and the blower drive motor. A control console equipped with the required input and output connections and the required software controls the operation of the variable speed motor controller.

The motor controller is a three-phase blower speed controller connected between the blower's power source and the blower drive motor. The motor controller is also connected to the epitaxial reactor system control console by way of three input/output lines. Two of the lines carry system control console input signals and one carries a system control output signal. One of the two input signals is an analog speed signal that provides input to the system control console regarding the blower motor speed. The second input signal is a speed controller error signal that provides input to the system control console. The speed controller error signal indicates when a malfunction with the speed controller exists. The output signal from the system control console is the analog speed control input signal to the speed controller. This signal instructs/regulates the speed controller to provide sufficient power to the blower motor for a particular rpm.

The specialized control software module resides in the control console. When the cleaning cycle is initiated, the system checks to see if the silicon or dopant gases are on. If on, then blower speed control is denied and the blower continues to run at the standard speed. If the silicon and dopant gases are not on, then the system checks various temperature sensors in the reactor and air flow plenums. If the temperatures are within a specified range, then blower speed control is initiated/inhibited, i.e. blower control runs at a reduced speed from normal operation. Otherwise, the normal blower speed is maintained and the cleaning cycle is aborted.

Basically, the blower speed is reduced once blower speed control is initiated. This allows the bell jar to increase in temperature above its normal operating temperature of about 600° C. to a higher temperature, which is within the range for the etching process to occur. The bell jar and chamber temperatures are continually checked. Should the bell jar and chamber temperatures move outside of the etching process range, blower speed control is denied and the standard blower speed is resumed. Also, the operator has the option of aborting the cleaning procedure. If a system abort is given, blower speed control is denied and the standard blower speed is resumed. If the bell jar and chamber temperatures stay within the predetermined acceptable range and no system abort command was given, then the cleaning process proceeds to completion. Once the cleaning process is complete, the system resumes standard blower speed control for normal operation.

None of the prior art devices allows for cleaning of the haze without dismantling the reactor system. Only one prior art device maximizes the number of deposition-etch sequences by monitoring infrared radiation emitted by the haze and the bell jar with an infrared detector. After a number of deposition-etch sequences, the residual haze remaining on the jar is too great to permit accurately controlling further deposition cycles. At this point, the reactor must be disassembled and the haze removed with a wet etch.

Additional advantages and embodiments of the present invention will be set forth in part in the detailed description that follows, and in part will be apparent from the description, or may be learned by practice of the invention. It is understood that the foregoing general description and the following detailed description are exemplary and explanatory and are intended to provide further explanation of the invention as claimed.

DETAILED DESCRIPTION OF THE PREFERRED EMBODIMENT

Figure 1:
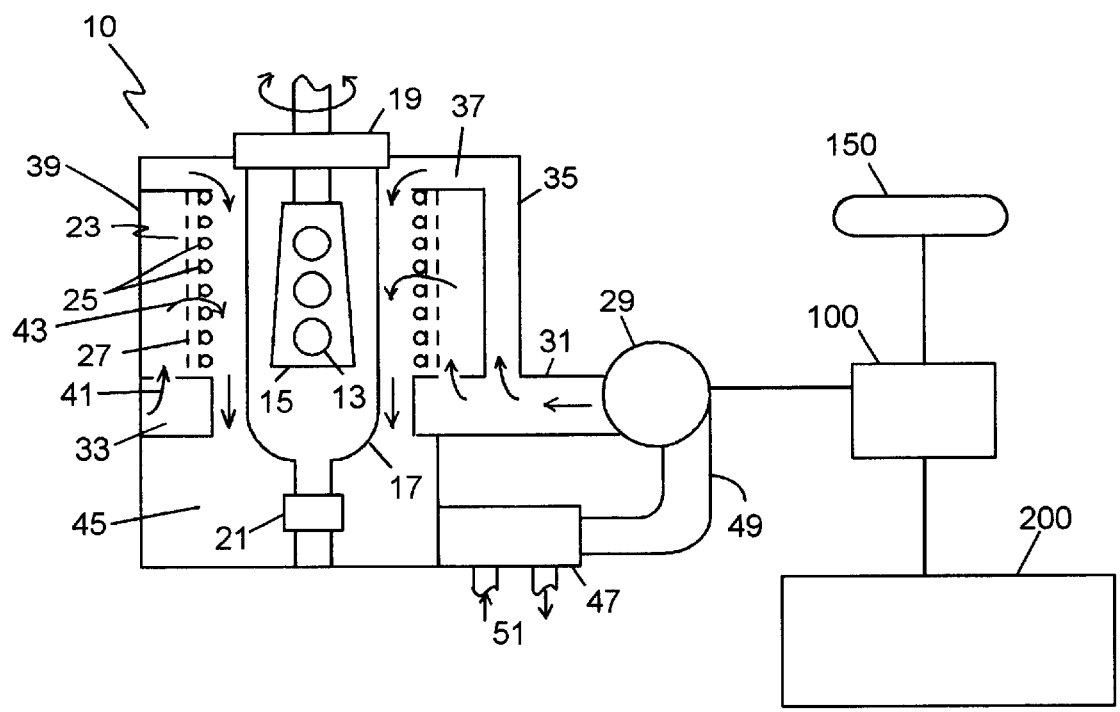
FIG. 1 is a cross-sectional view in schematic form of the present invention and an epitaxial deposition apparatus.

The preferred embodiment of the present invention is illustrated in FIGS. 1–10. FIG. 1 shows an epitaxial deposition device 10 used in forming epitaxial layers on semiconductor substrates 13 mounted on a graphite susceptor 15 within a quartz bell jar 17. An upper support 19 and a lower support 21 support bell jar 17 within epitaxial device 10. Bell jar 17 is also provided with ducts (not shown) for introducing a thermally activated reactive gas mixture to the interior of bell jar 17 during operation. Bell jar 17 is preferably shaped as a circular cylinder such that it possesses radial symmetry about its central axis.

Coaxially surrounding bell jar 17 is a distributed radiant heater 23. Radiant heater 23 uses a plurality of heating lamps 25, shown in cross-section, supported on a transversely air-permeable support frame 27. Lamps 25 may be linear, tubular halogen-quartz lamps capable of operating for long periods at temperatures in the region of 3,000 degrees Kelvin. Bell jar 17 is desirably made of quartz, which is capable of withstanding relatively high temperatures and is also relatively transparent to the thermal radiation from heater 23.

Substrates 13 and susceptor 15 are heated to temperatures normally in the region of about 900 to about 1,250 degrees Celsius by heater 23 to cause the thermally-reactive gas mixture in bell jar 17 to deposit the desired layer on the substrates 13. Examples of such thermally reactive gas mixtures are dichlorosilane, silane, silicon tetrachloride, and trichlorosilane in a hydrogen carrier gas in order to deposit a silicon epitaxial layer on substrates 13.

To produce an epitaxial layer of high quality and uniformity, the temperature of substrates 13 must be uniformly raised to the precise temperature needed to activate the chemical vapor deposition reaction. Using a distributed heater which produces fairly uniform heating over a large area, employing a coaxial geometry having radial symmetry, and continuously rotating substrates 13 and susceptor 15 during processing provides the uniformity required. To avoid unwanted deposition on the walls of bell jar 17, the temperature of these walls must be maintained well below the 900 to 1,250 degrees Celsius range. Preferably, the temperature of the walls of bell jar 17 is maintained in the range of about 600 degrees Celsius.

Blower 29 propels a high-volume stream of cooling air though its output duct 31 to cool device 10. The cool air generally enters a lower input plenum chamber 33 and, by way of a bypass duct 35, an upper input plenum chamber 37. Chambers 33 and 37 are toroidal in configuration and extend coaxially around device 10. From upper plenum chamber 37, cooling air flows radially inward and downwardly along the axis of bell jar 17 to cool bell jar 17. From lower plenum chamber 33, cooling air flows upwardly to enter the narrow region of space between the heater support 27 and the adjacent wall 39 of device 10, as indicated by arrows 41. As illustrated, arrow 41 extends upwardly through an aperture in the upper wall of plenum chamber 33. The upper wall of plenum chamber 33 is provided with a plurality of such apertures azimuthally spaced around chamber 33 to permit such upward flow of cooling air.

Air entering the region of space surrounding the heater 23 passes through slots in heater support 27 itself. This cooling air then joins the air flowing downwardly from upper input plenum chamber 37 and enters a coaxial output plenum chamber 45. From output plenum chamber 45, the heated exhaust air from device 10 flows to an air-to-water heat exchanger 47 and returns to blower 29 by way of an input duct 49.

Blower motor controller 100 is electrically coupled between blower 29 and a power source 150. Blower motor controller 100 is also electrically coupled to the system control module 200.

Figure 2:
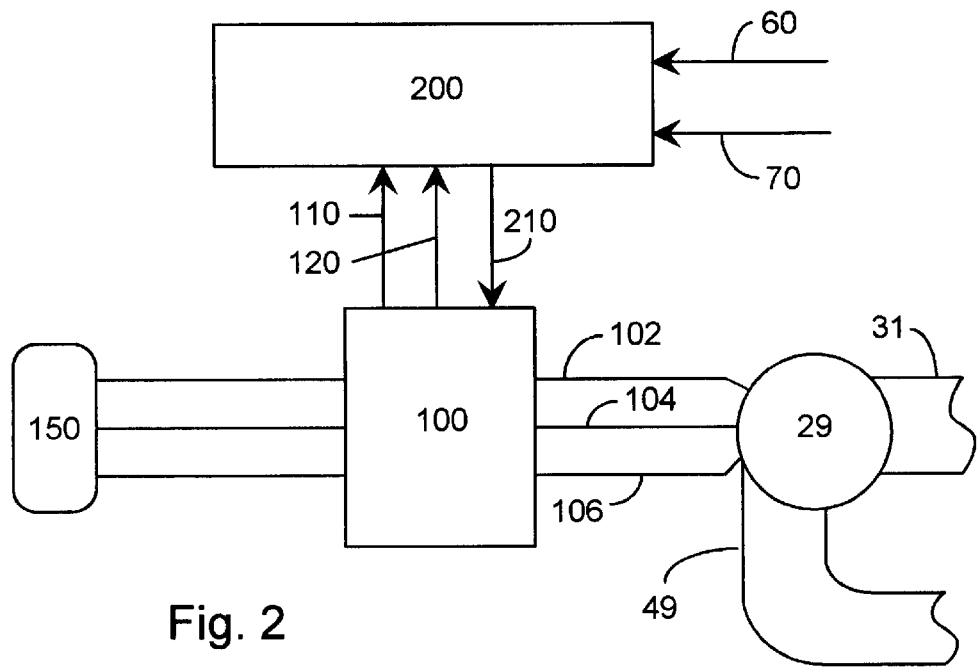
FIG. 2 is a schematic block diagram of the blower motor control connections to the power source, the blower and the control console.

Now turning to FIG. 2, blower motor controller 100 is a high-power, commercially available frequency inverter. It is a three-phase, 460 VAC motor speed controller. Blower motor controller 100 is installed between the blower's power source 150 and the blower drive motor of blower 29. Blower motor controller 100 also has three input/output lines connected to system control module 200. Line 102 is an output line for carrying the blower motor controller error signal to the system control module 200. Line 104 is also an output line to transmit the analog speed signal to the system control module 200. Line 106 is an input line for receiving an analog speed control input from the system control module 200 to the blower motor controller 100. An example of a component that can be used as blower motor controller 100 is a Baldor Corp. product, Product No. ID15H415-E available from New England Electric Service Motor Corp., 214 Arlington St., Chelsea, Mass. System control module 200 receives signals 60 and 70 from the external gas pressure/flow monitor (not shown) and the external temperature monitors (not shown), respectively. System control module 200 uses signals 60 and 70 to properly control the blower speed of blower 29 through blower motor controller 100.

Figure 3:
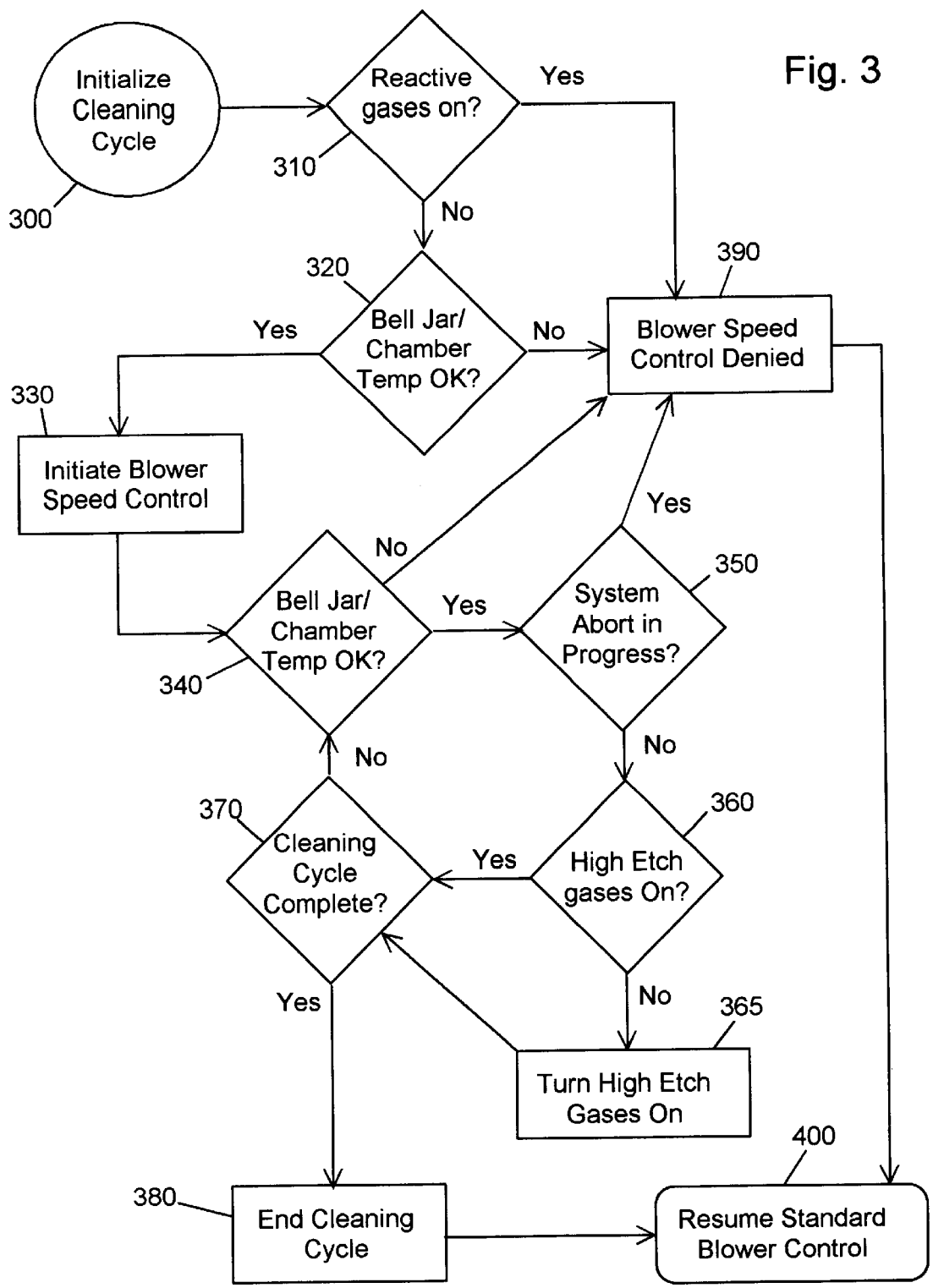
FIG. 3 is a flow chart illustrating execution of the cleaning cycle incorporating the present invention.

FIG. 3 is a flowchart illustrating the typical operation of the present invention for conducting a high etch cleaning cycle. To use the present invention, a blower motor controller 100 is installed on epitaxial deposition device 10 between the blower motor 29 and the blower motor power source 150. The three input/output lines of blower motor controller 100 are also connected to system control console 200 at appropriate contact points known to those skilled in the art. The epitaxial cleaning cycle control software is installed in system control console 200 and boots up the system. When the epitaxial deposition device 10 requires cleaning of the inside of bell jar 17, the user begins the cleaning cycle program.

Operation of the present invention proceeds as follows and as illustrated in FIG. 3. At step 300, the cleaning cycle is initialized. Once initialized by the user, the system checks to see if the reactive gases are on at step 310. This is provided by signal 60 from the gas flow monitor to system control console 200. If the reactive gases are on, the cleaning cycle is inhibited and blower speed control is denied at step 390 and blower control defaults to the standard 100% operation. If the reactive gases are off, then the various internal bell jar temperature and air flow sensors are checked. This is provided by signal 70 from the external temperature monitors to system control console 200. If the temperature and air flow readings are within an acceptable range (i.e. internal temperature of the bell jar is sufficient to etch the deposits on the inside surface of the bell jar and the air flow temperature on the outside of the bell jar in the vicinity of output plenum chamber 45 is maintained below the temperature that causes overheating of the O-ring seals in upper support 19 and lower support 21, then blower speed control is initiated at step 330. If the temperature is outside of the acceptable range, the cleaning cycle is aborted and the blower speed control is denied at step 390 and normal blower speed is resumed/maintained.

After blower speed control is initiated, the various internal bell jar temperature and air flow sensors are checked. This is again provided by signal 70. Because the purpose of the invention is to allow cleaning of the inside wall of bell jar 17, blower speed is reduced to allow the bell jar surface temperature to increase. This is required because of the activation energy required to permit the high rate etch process to proceed. The high rate etch is accomplished by reacting the deposited silicon on the inside wall of the bell jar with a high percent molar volume of hydrogen chloride gas and hydrogen gas introduced into the reaction chamber. The reaction is written as:

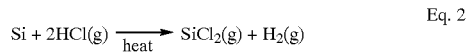

$$Si + 2HCl(g) \xrightarrow{heat} SiCl_2(g) + H_2(g) \qquad Eq.\ 2$$

Before the reactive gas in introduced, the various bell jar temperature and air flow sensors are checked at step 340 and must be within an acceptable range. If not then the cleaning cycle is aborted and blower speed control is denied at step 390. If the cleaning cycle temperatures, both inside and outside of the bell jar, are within the acceptable range, the system checks to see if there is a system abort in progress at step 350. A system abort could be user initiated or system initiated because of an incorrect monitor signal or sensor failure or anything that would cause the system control console 200 to shut down epitaxial deposition device 10. If a system abort is in progress, then blower speed control is denied at step 390. If no system abort is in progress, then the system control console 200 checks to see if the high etch gases are on at step 360. If they are not on, then the high etch gases are turned on at step 365 and the cleaning cycle proceeds. If the high etch gases are on, then the system checks to see if the cleaning cycle is complete at step 370. If the cleaning cycle is not complete, the system continues to cycle through the steps of checking to make sure the various reactor temperature and air flow sensor readings are always within the acceptable cleaning cycle ranges, that there is no system abort in progress, and that the cleaning cycle is not complete.

Once the cleaning cycle is complete, the cleaning cycle is ended at step 380. The cleaning cycle may be timed to operate for a predetermined period of time. Alternatively, the cleaning cycle may use one or more sensors to check the bell jar opacity/transparency. Once a predetermined opacity/transparency value is reached, the system control console 200 could end the cleaning cycle. Standard blower control is then resumed at step 400 and the epitaxial deposition device 10 is ready to continue the silicon or dopant deposition process.

Although the preferred embodiments of the present invention have been described herein, the above description is merely illustrative. Further modification of the invention herein disclosed will occur to those skilled in the respective arts and all such modifications are deemed to be within the scope of the invention as defined by the appended claims.

What is claimed is:

1. An epitaxial cleaning apparatus comprising;
    a blower controller module electrically connected between a blower of an epitaxial deposition device having a reaction chamber, a blower and a plurality of plenum chambers for delivering cooling air from said blower to said reaction chamber, and a blower power source for controlling the speed of said blower; and
    control module program code for controlling said blower controller module, said control module code adapted to be installed within a control module connected to said epitaxial deposition device for controlling the operation of said epitaxial deposition device and wherein said control module program code includes program code means to effect reading the temperature of a cooling air in an exhaust plenum of said epitaxial deposition device and maintaining the temperature of said cooling air within a predetermined temperature range by adjusting the speed of said blower.

2. The apparatus as claimed in claim 1 wherein said blower controller module has an analog speed control input, an analog speed control output and a speed control error signal output.

3. The apparatus as claimed in claim 2 wherein said analog speed control input, said analog speed control output and said speed control error signal output are connected to said control module.

4. The apparatus as claimed in claim 1 wherein said control module code further includes program code means to effect initiating blower speed control to increase the temperature of a surface of a bell jar of said reaction chamber.

5. The apparatus as claimed in claim 1 wherein said control module code further includes program code means to effect introducing a reactant gas into a bell jar of said reaction chamber for reacting with a material deposited on an inside surface of said bell jar, said reaction forming gaseous reactant by-products.

6. The apparatus as claimed in claim 1 wherein said control module code further includes program code means to effect purging a bell jar of said reaction chamber with a purging gas.

7. The apparatus as claimed in claim 1 wherein said control module code further includes program code means to effect monitoring the temperature of a surface of bell jar of said reaction chamber while said epitaxial deposition device is in cleaning mode.

8. The apparatus as claimed in claim 1 wherein said control module code further includes program code means to effect ending blower speed control, resuming blower speed control to a preset speed and decreasing the temperature of a surface of a bell jar of said reaction chamber.

9. The apparatus as claimed in claim 1 wherein said control module code further includes program code means to effect aborting the cleaning of an inside surface of a bell jar of reaction chamber when the temperature of the surface of said bell jar is outside a predetermined temperature range.

10. An epitaxial reactor in-situ cleaning kit comprising:
    a blower motor controller having a power input connection adapted to be connected to a power source, a power output connection adapted to be connected to a blower motor of an epitaxial reactor, and an input/output connection adapted to be connected to an epitaxial system control console; and
    a program product comprising a computer usable medium having computer readable program code means embodied therein for controlling said blower motor controller to induce cleaning of an inside surface of a bell jar of an epitaxial reactor, said readable program code means in said program product comprising:
        computer readable program code means for causing said system control console to effect initiating blower speed control to increase the temperature of the surface of said bell jar by reducing blower speed;
        computer readable program code means for causing said system control console to effect reading the temperature of said surface of said bell jar and an air flow within an exhaust plenum and maintaining the temperature of said surface and said air flow within said exhaust plenum within a predetermined temperature range;
        computer readable program code means for causing said system control console to effect introducing a reactant gas into said bell jar for reacting with a material deposited on the inside surface of said bell jar forming gaseous reactant by-products; and
        computer readable program code means for causing said system control console to effect purging said bell jar with a purging gas.

11. The kit as claimed in claim 10 wherein said readable program code means in said program product further includes computer readable program code means for causing said system control console to continuously monitor the temperature of said surface of said bell jar and said air flow within said exhaust plenum while said epitaxial reactor is in cleaning mode.

12. The kit as claimed in claim 10 wherein said readable program code means in said program product further includes computer readable program code means to effect ending blower speed control, resuming blower speed control to a preset speed and decreasing the temperature of the surface of said bell jar.

13. The kit as claimed in claim 10 wherein said readable program code means in said program product further includes computer readable program code means to effect aborting said cleaning of said inside surface of said bell jar when the temperature of said surface of said bell jar is outside said predetermined temperature range.

* * * * *